United States Patent
Chueh et al.

(10) Patent No.: US 9,840,764 B2
(45) Date of Patent: Dec. 12, 2017

(54) METHOD OF FABRICATING TRANSITION METAL DICHALCOGENIDE

(71) Applicant: NATIONAL TSING HUA UNIVERSITY, Hsinchu (TW)

(72) Inventors: Yu-Lun Chueh, Hsinchu (TW); Henry Medina, Hsinchu (TW); Yu-Ze Chen, Tainan (TW); Jian-Guang Li, New Taipei (TW); Teng-Yu Su, Kaohsiung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/870,014

(22) Filed: Sep. 30, 2015

(65) Prior Publication Data

US 2017/0088945 A1     Mar. 30, 2017

(51) Int. Cl.
*C23C 14/08*     (2006.01)
*C23C 16/00*     (2006.01)
(Continued)

(52) U.S. Cl.
CPC ............ *C23C 14/08* (2013.01); *C23C 14/083* (2013.01); *C23C 14/5826* (2013.01);
(Continued)

(58) Field of Classification Search
CPC ......... C23C 14/00; C23C 16/00; H01L 21/00; H01L 31/00; H01L 35/00
See application file for complete search history.

(56) References Cited

U.S. PATENT DOCUMENTS 4,539,052 A * 9/1985 Palmer ............... C23C 8/62
                                                  148/240
4,640,830 A * 2/1987 Arakawa ........... C30B 25/005
                                                  423/345

(Continued)

OTHER PUBLICATIONS

"Sound-Driven Piezoelectric Nanowire-Based Nanogenerators", by Seung Nam Cha, Ju-Seok Seo, Seong Min Kim, Hyun Jin Kim, Young Jun Park, Sang-Woo Kim, and Jong Min Kim, Adv. Mater. 2010, 22, 4726-4730.*

(Continued)

*Primary Examiner* — David Turocy
*Assistant Examiner* — Mohammad Mayy
(74) *Attorney, Agent, or Firm* — CKC & Partners Co., Ltd.

(57) ABSTRACT

A method of fabricating transition metal dichalcogenides includes a preparing step, a steaming step and a depositing step. The preparing step is performed for providing a transition metal substrate, a reactive gas and a solid chalcogenide. The steaming step is performed for heating the solid chalcogenide to generate a chalcogenide gas in a steaming space. The depositing step is performed for introducing the reactive gas into the chalcogenide gas to ionize the chalcogenide gas so as to generate a chalcogenide plasma in a depositing space. The depositing step is performed under a process vacuum pressure from low vacuum pressure to atmospheric pressure. The reactive gas and the chalcogenide gas are flowed from top to bottom through a top of the transition metal substrate. The loading substrate is heated at a loading substrate temperature, and the steaming space is different from the depositing space.

22 Claims, 11 Drawing Sheets

(51) Int. Cl.
*H01L 35/00* (2006.01)
*H01L 21/00* (2006.01)
*H01L 31/00* (2006.01)
*C23C 14/58* (2006.01)

(52) U.S. Cl.
CPC .......... C23C 14/5866 (2013.01); C23C 16/00 (2013.01); H01L 21/00 (2013.01); H01L 31/00 (2013.01); H01L 35/00 (2013.01)

(56) References Cited

U.S. PATENT DOCUMENTS

| | | | | |
|---|---|---|---|---|
| 5,028,488 | A | * | 7/1991 | Nakagawa ........ H01L 31/02966 136/258 |
| 5,219,708 | A | * | 6/1993 | Hirata ................ G11B 7/24024 346/135.1 |
| 6,030,848 | A | * | 2/2000 | Yuge .................... H01L 33/007 148/DIG. 3 |
| 2004/0089410 | A1 | * | 5/2004 | Tenne .................... B82Y 15/00 156/230 |
| 2007/0196984 | A1 | * | 8/2007 | Lee ..................... C23C 14/0052 438/257 |
| 2009/0020745 | A1 | * | 1/2009 | Jeong .................. G11C 13/003 257/4 |
| 2016/0314968 | A1 | * | 10/2016 | Kim ........................ C09D 1/00 |

OTHER PUBLICATIONS

"Chemically Synthesized Heterostructures of Two-Dimensional Molybdenum/Tungsten-Based Dichalcogenides with Vertically Aligned Layers", Yeonwoong Jung, Jie Shen Yong Sun, and Judy J. Cha, vol. 8, No. 9, 9550-9557, 2014.*

Summary of the 228th ECS (Electrochemical Society) Meeting, Monday, Oct. 12, 2015, Phoenix, AZ, American for "Plasma Assisted Low Temperature Synthesis of WSe2" of Henry Medina et al.

* cited by examiner

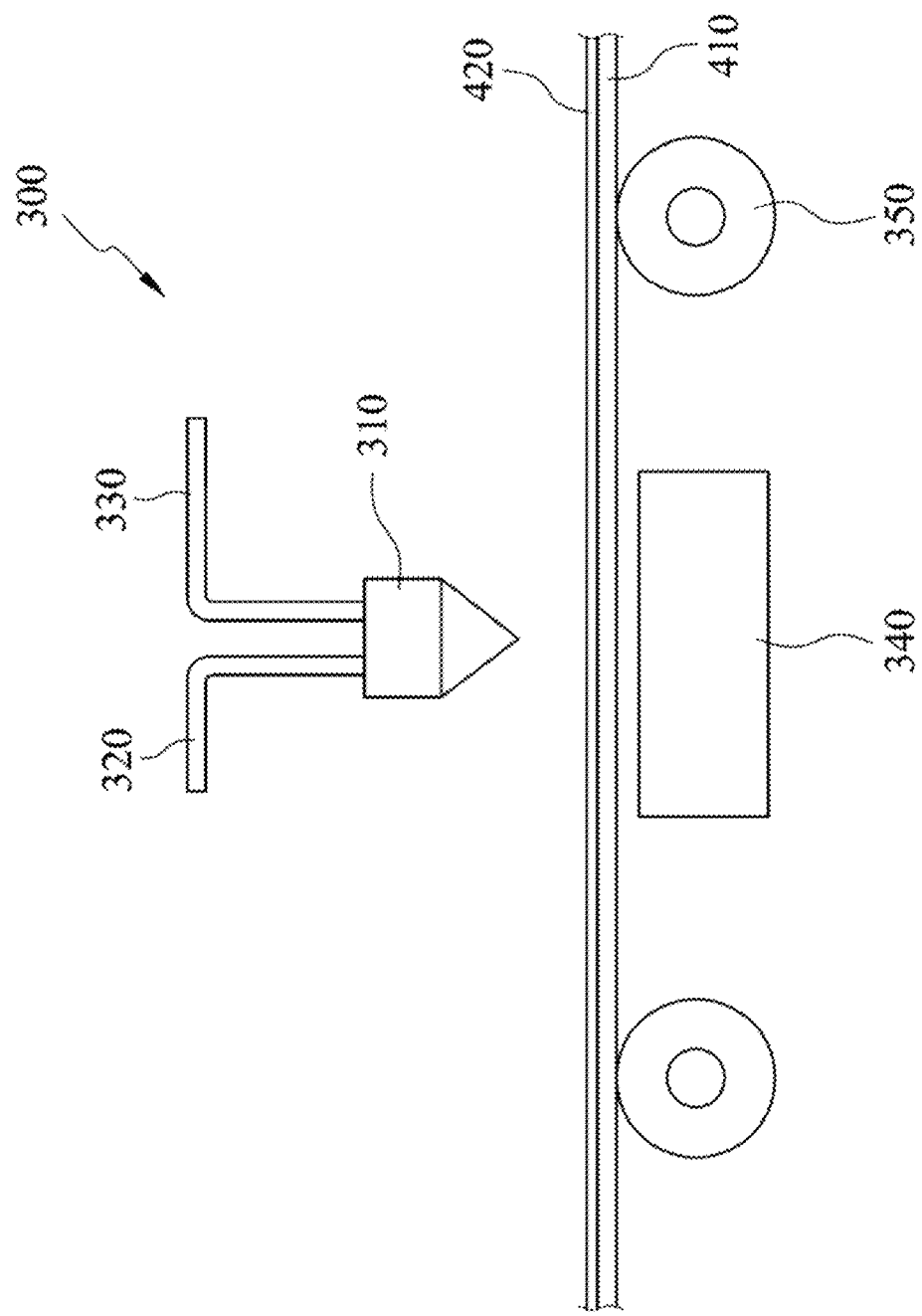

METHOD OF FABRICATING TRANSITION METAL DICHALCOGENIDE

BACKGROUND

Technical Field

The present disclosure relates to methods of fabricating transition metal dichalcogenides. More particularly, the present disclosure relates to methods of fabricating transition metal dichalcogenides at low temperature.

Description of Related Art

In recent years, two-dimensional material such as graphene, has become the most popular scientific research topic in the material science because of its excellent electrical properties, optical properties and physical characteristics. Moreover, its high energy efficiency is very useful for various applications such as fuel cells, solar batteries, flexible displays, capacitors, sensors, etc.

However, graphene is a material that has zero band gap in its native state, thus it is difficult to integrate graphene with current silicon process. In contrast, transition metal dichalcogenides (TMDs) has a band gap between the conduction and valence band, so that TMDs has become a new direction of scientific research.

TMDs are layered materials with strong in-plane bonding and weak out-of-plane interactions similar to graphite. Although the physical properties bulk TMDs have been studied for decades, recent studies have predicted exceptional physical properties upon reduced dimensionality attracting lots of attention due to the versatile chemistry displayed in 2D. Properties such as a direct bandgap with high mobility when TMDs reach nanometer scale thickness, making TMDs very attractive for low power and high speed electronics, optoelectronics, light emission, and sensors between others. Nevertheless, the lack of a large area and reliable synthesis method that can be combined with the actual manufacturing process for electronic devices is a major drawback for the development of this technology.

Conventionally, a peeling method such as exfoliation and a chemical vapor deposition (CVD) method are usually used for fabricating TMDs. Although the peeling method is simple and can generate high-quality two-dimensional material, the number of the film layer is difficult to control, and it is very difficult to apply in large scale production. In addition, the CVD method need high temperature over 500° C. under degree of vacuum of more than 760 Torr for fabricating TMDs, and Hydrogen sulfide, $H_2S$, is a toxic gas that is usually used as the fabricating source in the CVD method.

SUMMARY

According to one aspect of the present disclosure, a method of fabricating transition metal dichalcogenides includes a preparing step, a steaming step and a depositing step. The preparing step is performed for providing a transition metal substrate, a reactive gas and a solid chalcogenide. The steaming step is performed for heating the solid chalcogenide to generate a chalcogenide gas in a steaming space. The depositing step is performed for introducing the reactive gas into the chalcogenide gas to ionize the chalcogenide gas so as to generate a chalcogenide plasma in a depositing space. The chalcogenide plasma is reacted with a surface of the transition metal substrate to form a transition metal dichalcogenide layer by heating the transition metal substrate, and the depositing step is performed under a process vacuum pressure. In the depositing step, the reactive gas and the chalcogenide gas are flowed from top to bottom through a top of the transition metal substrate. The process vacuum pressure is performed from low vacuum pressure to atmospheric pressure. The loading substrate is heated at a loading substrate temperature from 150° C. to 500° C., and the steaming space is different from the depositing space.

According to another aspect of the present disclosure, a method of fabricating transition metal dichalcogenides includes a preparing step, a pre-plating step, a steaming step and a depositing step. The preparing step is performed for providing a loading substrate, a solid transition metal, a reactive gas and a solid chalcogenide. The pre-plating step is performed for heating the solid transition metal to generate a transition metal gas so as to deposit the transition metal gas on the loading substrate to form a transition metal oxide layer in a pre-plating space. The steaming step is performed for heating the solid chalcogenide to generate a chalcogenide gas in a steaming space. The depositing step is performed for introducing the reactive gas into the chalcogenide gas to ionize the chalcogenide gas so as to generate a chalcogenide plasma in a depositing space. The chalcogenide plasma is reacted with a surface of the transition metal oxide layer to form a transition metal dichalcogenide layer by heating the loading substrate. The depositing step is performed under a process vacuum pressure. In the depositing step, the reactive gas and the chalcogenide gas are flowed from top to bottom through a top of the transition metal oxide layer. The process vacuum pressure is performed from low vacuum pressure to atmospheric pressure. The loading substrate is heated at a loading substrate temperature from 150° C. to 500° C. The depositing space is different from the steaming space and the pre-plating space.

According to further another aspect of the present disclosure, a method of fabricating transition metal dichalcogenides includes a preparing step, a pre-plating step, a steaming step and a depositing step. The preparing step is performed for providing a loading substrate, a solid transition metal, a reactive gas and a solid chalcogenide. The pre-plating step is performed for heating the solid transition metal to generate a transition metal gas so as to deposit the transition metal gas on the loading substrate to form a transition metal layer in a pre-plating space. The steaming step is performed for heating the solid chalcogenide to generate a chalcogenide gas in a steaming space. The depositing step is performed for introducing the reactive gas into the chalcogenide gas to ionize the chalcogenide gas so as to generate a chalcogenide plasma in a depositing space. The chalcogenide plasma is reacted with a surface of the transition metal layer to form a transition metal dichalcogenide layer by heating the loading substrate. The depositing step is performed under a process vacuum pressure. In the depositing step, the reactive gas and the chalcogenide gas are flowed from top to bottom through a top of the transition metal layer. The process vacuum pressure is performed from low vacuum pressure to atmospheric pressure. The loading substrate is heated at a loading substrate temperature from 150° C. to 500° C. The depositing space is different from the steaming space and the pre-plating space.

BRIEF DESCRIPTION OF THE DRAWINGS

The present disclosure can be more fully understood by reading the following detailed description of the embodiment, with reference made to the accompanying drawings as follows:

FIG. 11 is a schematic view of a processing system of fabricating transition metal dichalcogenides used in FIG. 10.

DETAILED DESCRIPTION

Figure 1:
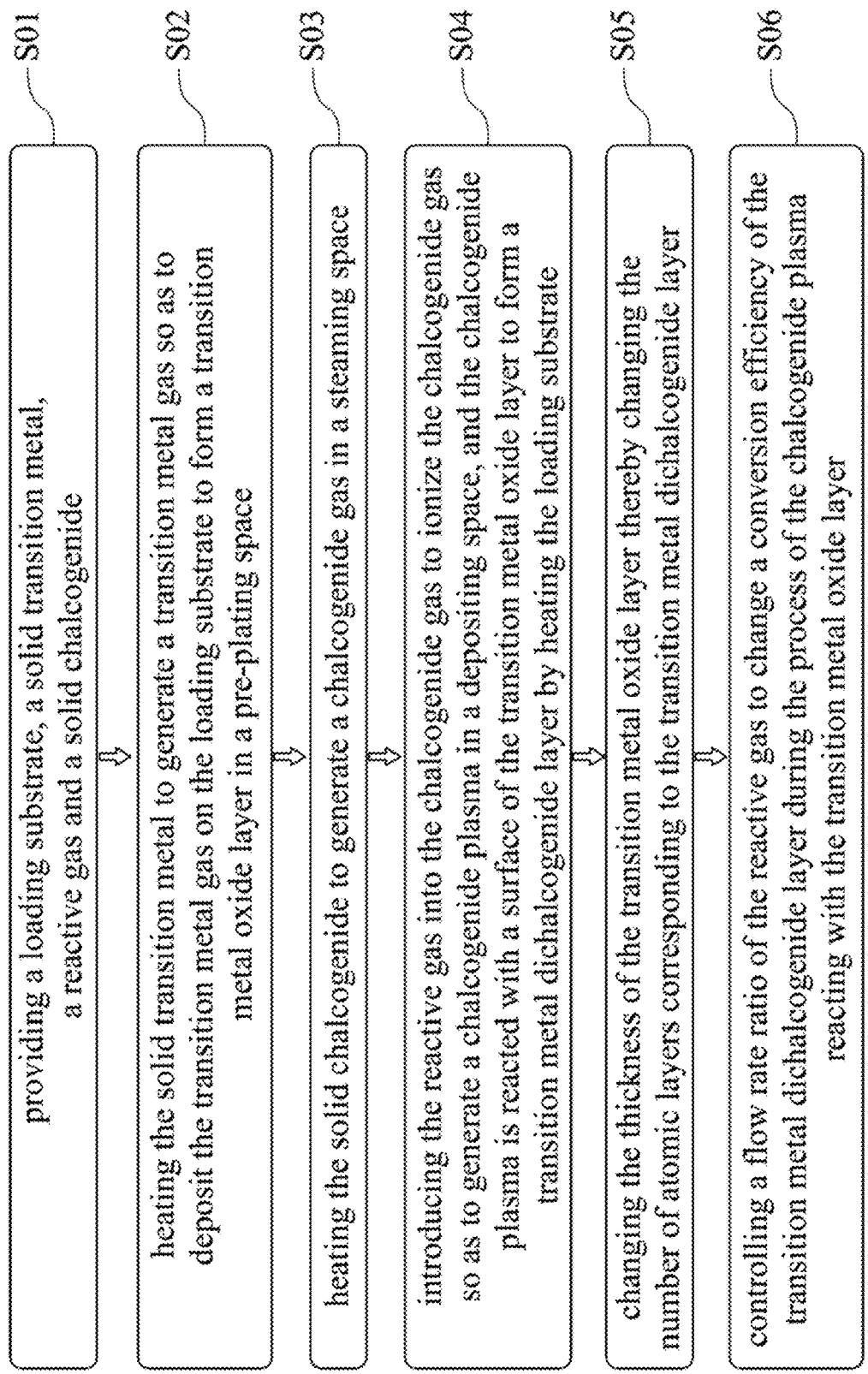
FIG. 1 is a flow chart showing a method of fabricating transition metal dichalcogenides according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In this invention, a low temperature synthesis of transition metal dichalcogenides (TMDs) is achieved that allows the direct synthesis of TMDs on low temperature substrates including commercial glass and polymide for flexible electronics for device fabrication without a further transfer process. Different from the actual chemical vapour deposition (CVD) process, the process of the invention can be carried out at a loading substrate temperature as low as 150° C. making it compatible with the actual semiconductor fabrication process.

Figure 2:
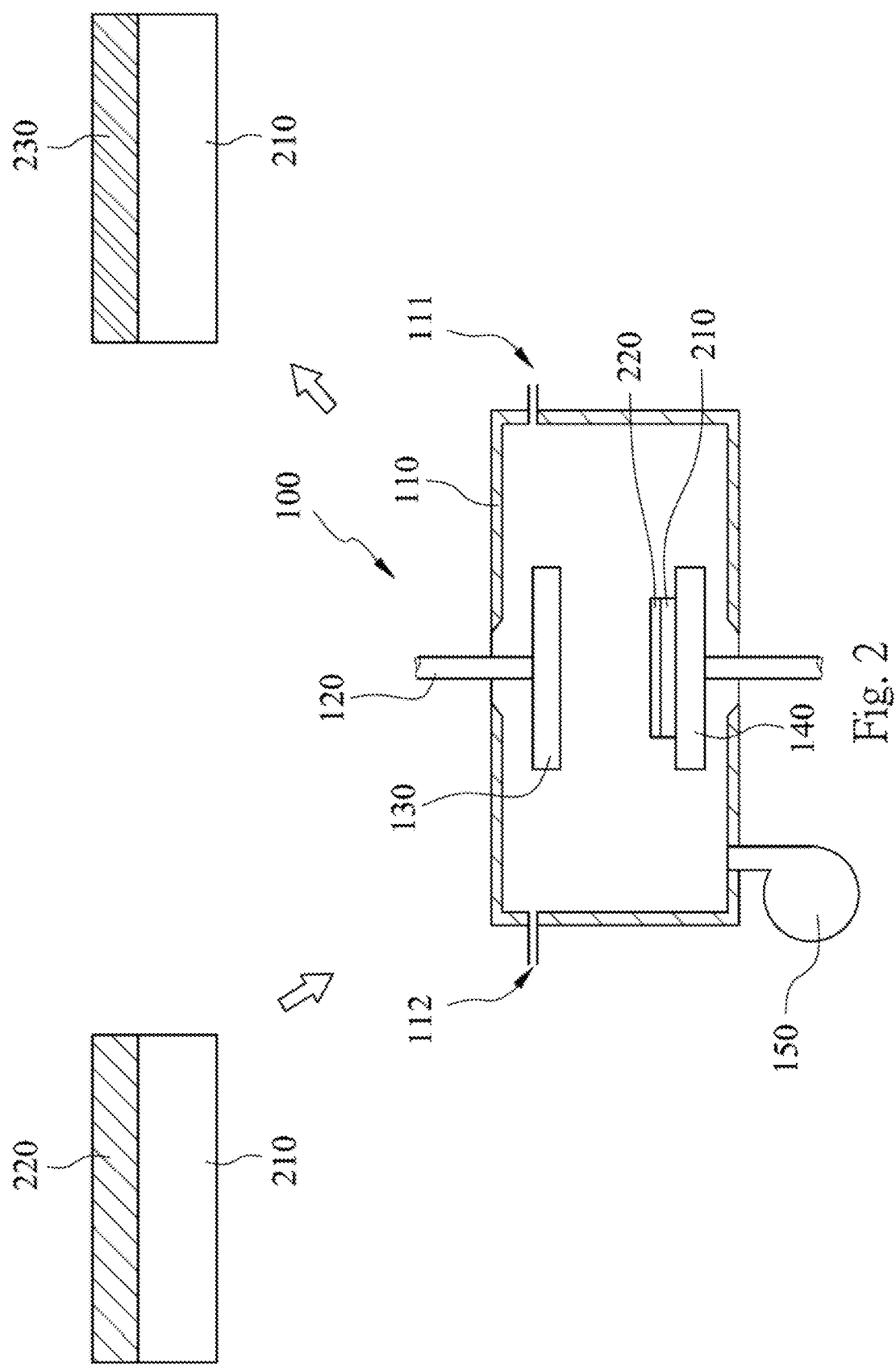
FIG. 2 is a schematic view of a processing system of fabricating transition metal dichalcogenides used in FIG. 1.

FIG. 1 is a flow chart showing a method of fabricating TMDs according to one embodiment of the present disclosure; and FIG. 2 is a schematic view of the plasma enhanced processing system 100 of fabricating transition metal dichalcogenides used in FIG. 1. In FIG. 1, the method of fabricating TMDs using the plasma enhanced processing system 100 includes a preparing step S01, a pre-plating step S02, a steaming step S03, a depositing step S04, a thickness controlling step S05 and a conversion controlling step S06. In FIG. 2, the plasma enhanced processing system 100 includes a reaction chamber 110, a radio frequency generator 120, an electrode 130, a heater 140 and a vacuum pump 150. The reaction chamber 110 has a first gas inlet 111 and a second gas inlet 112. The reaction chamber 110 is a depositing space. The first gas inlet 111 is used for conveying nitrogen gas and a chalcogenide gas generated by heating the solid chalcogenide, and the second gas inlet 112 is used for conveying hydrogen gas to serve as a plasma source. This architecture of the plasma enhanced processing system 100 is well known in the prior art and is not described in detail so as not to unnecessarily obscure aspects of the invention.

In FIG. 1, the preparing step S01 is performed for providing a loading substrate 210, a solid transition metal, a reactive gas and a solid chalcogenide.

The pre-plating step S02 is performed for heating the solid transition metal to generate a transition metal gas so as to deposit the transition metal gas on the loading substrate 210 to form a transition metal oxide layer 220 in a pre-plating space.

The steaming step S03 is performed for heating the solid chalcogenide to generate a chalcogenide gas in a steaming space.

The depositing step S04 is performed for introducing the reactive gas into the chalcogenide gas to ionize the chalcogenide gas so as to generate a chalcogenide plasma in a depositing space. The chalcogenide plasma is reacted with a surface of the transition metal oxide layer 220 to form a transition metal dichalcogenide layer 230 by heating the loading substrate 210. The depositing step S04 is performed under a process vacuum pressure.

The thickness controlling step S05 is performed for changing the thickness of the transition metal oxide layer 220 thereby changing the number of atomic layers corresponding to the transition metal dichalcogenide layer 230.

The conversion controlling step S06 is performed for controlling a flow rate ratio of the reactive gas with nitrogen and hydrogen to change a conversion efficiency of the transition metal dichalcogenide layer 230 during the process of the chalcogenide plasma reacting with the transition metal oxide layer 220.

According to above-mentioned steps S01-S06, the method of fabricating the transition metal dichalcogenide layer 230 using the plasma enhanced processing system 100 can form the transition metal oxide layer 220 on the loading substrate 210. Then, the chalcogenide gas and the reactive gas with nitrogen and hydrogen are mixed and inputted into the reaction chamber 110 for assistantly ionizing the chalcogenide gas to generate a chalcogenide plasma. Finally, the chalcogenide plasma is reacted with the transition metal oxide layer 220 to form the transition metal dichalcogenide layer 230.

In detail, in the pre-plating step S02, the transition metal gas is deposited on the loading substrate 210 to form a transition metal oxide layer 220 in the pre-plating space. The pre-plating space is located outside the reaction chamber 110. The loading substrate 210 with the transition metal oxide layer 220 is putted into the reaction chamber 110 after the pre-plating step S02, so that the temperature of the heated solid transition metal in the pre-plating space will not affect the loading substrate temperature in the depositing step S04.

In the steaming step S03, the solid chalcogenide is heated to generate the chalcogenide gas in a steaming space. The pre-plating space is also located outside the reaction chamber 110. Then, the chalcogenide gas and the reactive gas are putted into the reaction chamber 110 after the steaming step S03, so that the temperature of the heated solid chalcogenide in the steaming space will not affect the loading substrate temperature in the depositing step S04.

In the depositing step S04, the reactive gas and the chalcogenide gas are flowed from top to bottom through a top of the transition metal oxide layer 220. The process vacuum pressure is performed from low vacuum pressure to atmospheric pressure. The loading substrate 210 is heated at a loading substrate temperature from 150° C. to 500° C. The depositing space, i.e. the reaction chamber 110, is different from the steaming space of the steaming step S03 and the pre-plating space of the pre-plating step S02.

The loading substrate 210 is made of polyamide, stainless steel, glass, silicon nitride($Si_3N_4$), silicon dioxide($SiO_2$), aluminum oxide($Al_2O_3$) or hafnium oxide($HfO_2$). The solid transition metal is made of tungsten, molybdenum, nickel, copper, indium, germanium, tantalum, iron, cobalt or titanium. The solid chalcogenide is made from sulfur, selenium or tellurium. If the solid chalcogenide is made from sulfur, the solid chalcogenide is heated at a temperature from 90° C. to 150° C. in the depositing step S03. If the solid chalcogenide is made from selenium, the solid chalcogenide is heated at a temperature from 150° C. to 300° C. in the depositing step S03. If the solid chalcogenide is made from tellurium, the solid chalcogenide is heated at a temperature from 400° C. to 650° C. in the depositing step S03. Theoretically, the temperature need to reach the melting temperature for vaporizing. However, the process will be in a start-up procedure to fabricate TMDs at the temperature near the melting temperature of the corresponding material (sulfur, selenium or tellurium). In addition, the pre-plating step S02 can form the transition metal oxide layer 220 by an atomic layer epitaxy process, a sputtering process or an evaporation process.

In the depositing step S04, the transition metal dichalcogenide layer 230 can be formed in the plasma enhanced processing system 100 under the process vacuum pressure. The process vacuum pressure is greater than or equal to 2 Torr and is smaller than or equal to 760 Torr (atmospheric pressure). The plasma enhanced processing system 100 has a plasma power which is greater than or equal to 0 watt and smaller than or equal to 500 watts. The loading substrate 210 is heated at a loading substrate temperature from 150° C. to 500° C. After the pre-plating step S02, a thickness of the transition metal oxide layer 220 is greater than or equal to 1 nm and smaller than or equal to 10 nm. When the thickness is smaller than 7 nm and the loading substrate temperature is higher than or equal to 500° C., the plasma power is 0 watt in the plasma enhanced processing system 100. This is because the loading substrate temperature is increased sufficient to ionize sulfur, selenium or tellurium, and there is no need for the plasma power produced by the radio frequency generator 120.

The thickness controlling step S05 is for generating one atomic layer corresponding to the transition metal dichalcogenide layer 230 when the thickness of the transition metal oxide layer 220 is equal to 1 nm. In other words, the change of the thickness of the transition metal oxide layer 220 will affect the number of atomic layer corresponding to the transition metal dichalcogenide layer 230. Hence, the number of atomic layer of the transition metal dichalcogenide layer 230 can be well controlled by users to obtain the wanted thickness of the transition metal oxide layer 220.

The conversion controlling step S06 is performed for controlling the flow rate ratio between nitrogen and hydrogen to change a conversion efficiency of the transition metal dichalcogenide layer 230 during the process of the chalcogenide plasma reacting with the transition metal oxide layer 220. The reactive gas includes nitrogen and hydrogen, and the flow rate ratio between nitrogen and hydrogen is 1:1, 1:2, 2:1 or 0:1.

Figure 3:
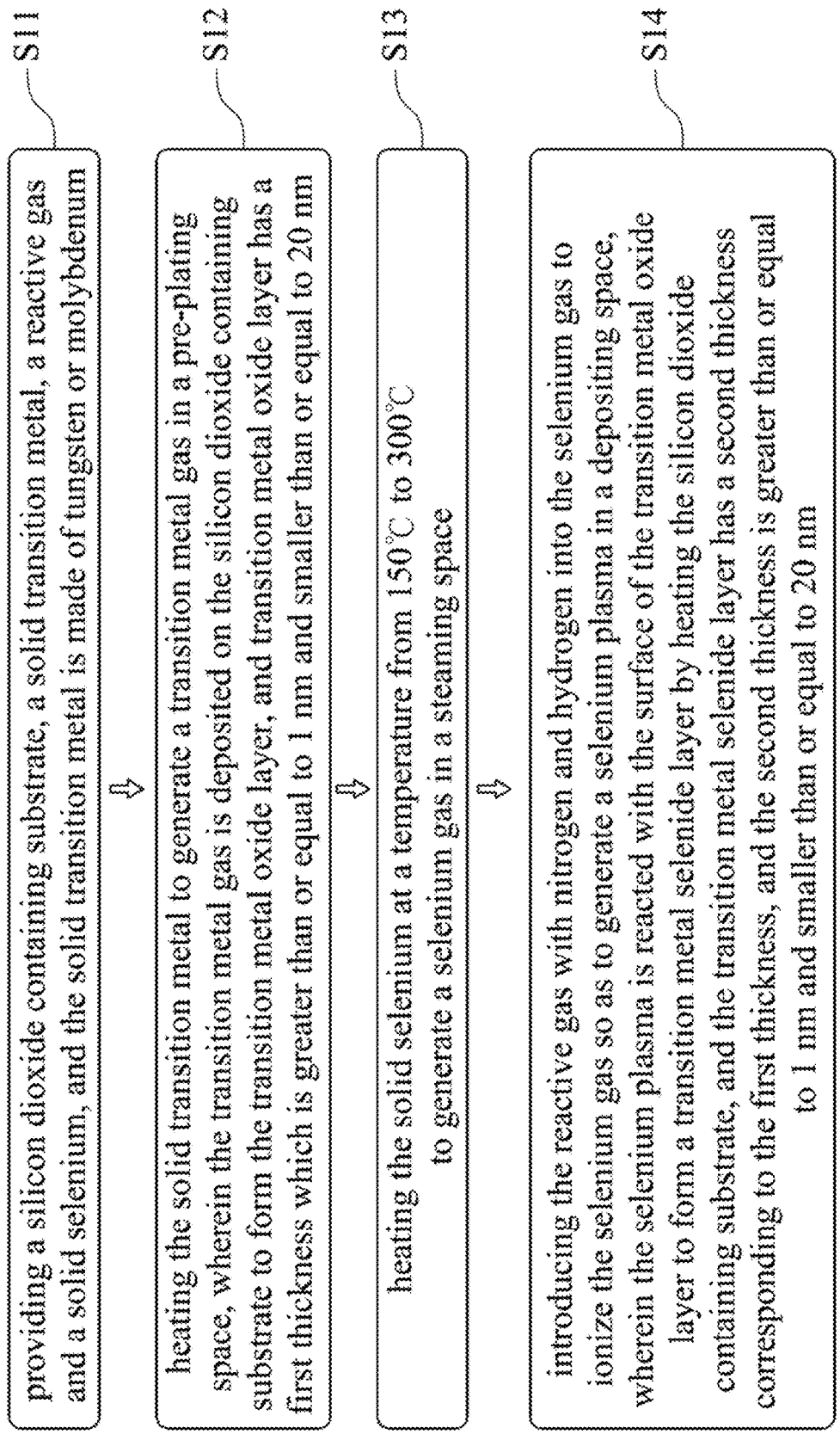
FIG. 3 is a flow chart showing a method of fabricating transition metal selenides according to another embodiment of the present disclosure.

FIG. 3 is a flow chart showing a method of fabricating transition metal selenides using the plasma enhanced processing system 100 according to another embodiment of the present disclosure. In FIG. 3, the method of fabricating transition metal selenides includes a preparing step S11, a pre-plating step S12, a steaming step S13 and a depositing step S14.

The preparing step S11 is performed for providing a silicon dioxide containing substrate, a solid transition metal, a reactive gas and a solid selenium. The solid transition metal is made of tungsten or molybdenum.

The pre-plating step S12 is performed for heating the solid transition metal to generate a transition metal gas in a pre-plating space. The transition metal gas is deposited on the silicon dioxide containing substrate to form the transition metal oxide layer 220, and transition metal oxide layer 220 has a first thickness which is greater than or equal to 1 nm and smaller than or equal to 20 nm.

The steaming step S13 is performed for heating the solid selenium at a temperature from 150° C. to 300° C. to generate a selenium gas in a steaming space.

The depositing step S14 is performed for introducing the reactive gas with nitrogen and hydrogen into the selenium gas to ionize the selenium gas so as to generate a selenium plasma in a depositing space, i.e. the reaction chamber 110. The selenium plasma is reacted with the surface of the transition metal oxide layer 220 to form a transition metal selenide layer 230 by heating the silicon dioxide containing substrate 210. The depositing step S14 is performed under a process vacuum pressure. The transition metal selenide layer 230 has a second thickness corresponding to the first thickness, and the second thickness is greater than or equal to 1 nm and smaller than or equal to 20 nm.

In this embodiment, the thickness controlling step S05 and the conversion controlling step S06 can be performed according to a user's requirements or needs. In the depositing step S14, the reactive gas and the selenium gas are flowed from top to bottom through a top of the transition metal oxide layer 220. The process vacuum pressure is performed from low vacuum pressure to atmospheric pressure. The silicon dioxide containing substrate 210 is heated at a loading substrate temperature from 150° C. to 500° C. The plasma enhanced processing system 100 has a plasma power which is greater than or equal to 0 watt and smaller than or equal to 500 watts. The depositing space, i.e. the reaction chamber 110, is different from the steaming space of the steaming step S13 and the pre-plating space of the pre-plating step S12, so that the temperature of the heated solid selenium in the steaming space and the temperature of the heated solid transition metal in the pre-plating space will not affect the loading substrate temperature in the depositing step S14.

In this embodiment, the method of fabricating transition metal selenides using the plasma enhanced processing system 100 is used to generate a tungsten selenide or a molybdenum selenide. In another embodiment, the solid transition metal is made of platinum, the method of fabricating transition metal selenides using the plasma enhanced processing system 100 is also used to generate a platinum selenide. In addition, the pure platinum can be used to generate the platinum selenide without the oxidation procedure in the pre-plating step S12.

Figure 4:
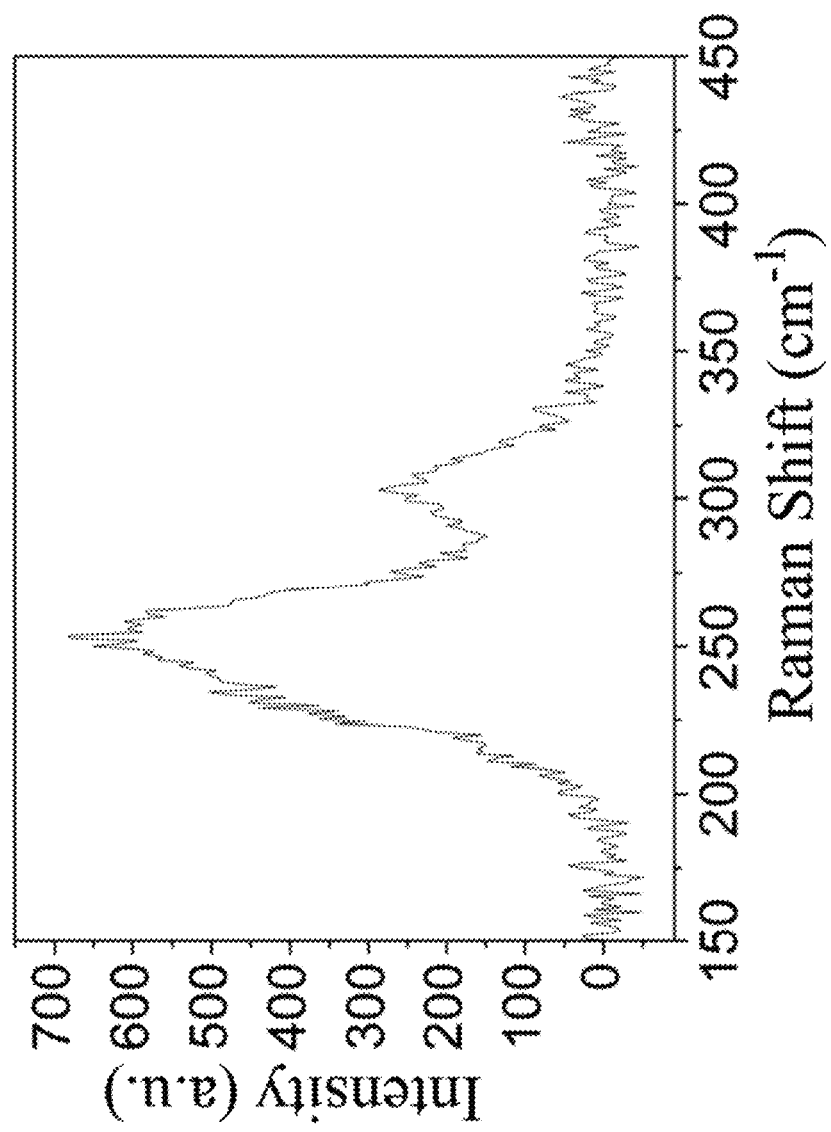
FIG. 4 is a characteristic curve showing a Raman spectrum of the tungsten diselenide of the present disclosure.
Figure 5:
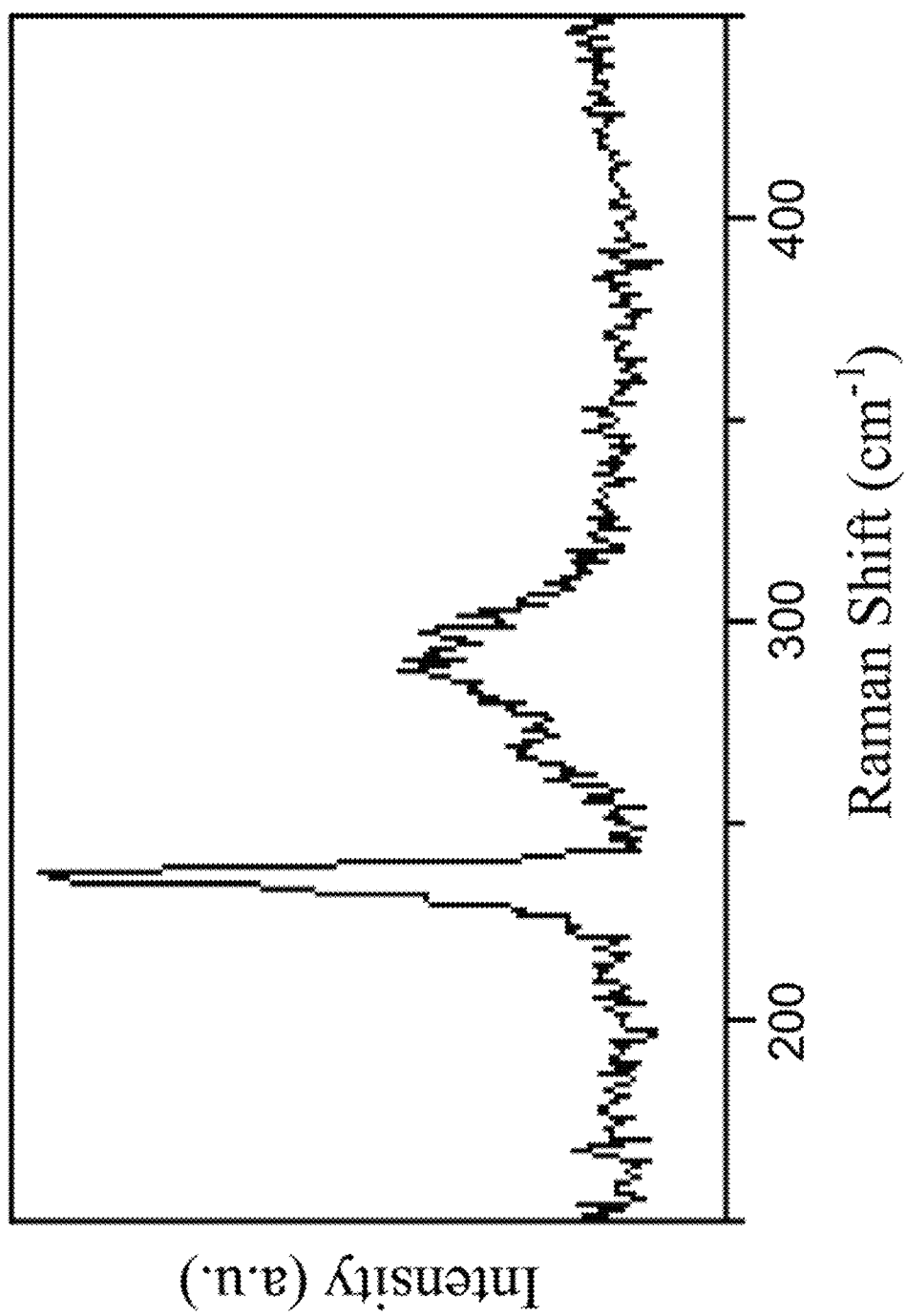
FIG. 5 is a characteristic curve showing a Raman spectrum of the molybdenum diselenide of the present disclosure.
Figure 6:
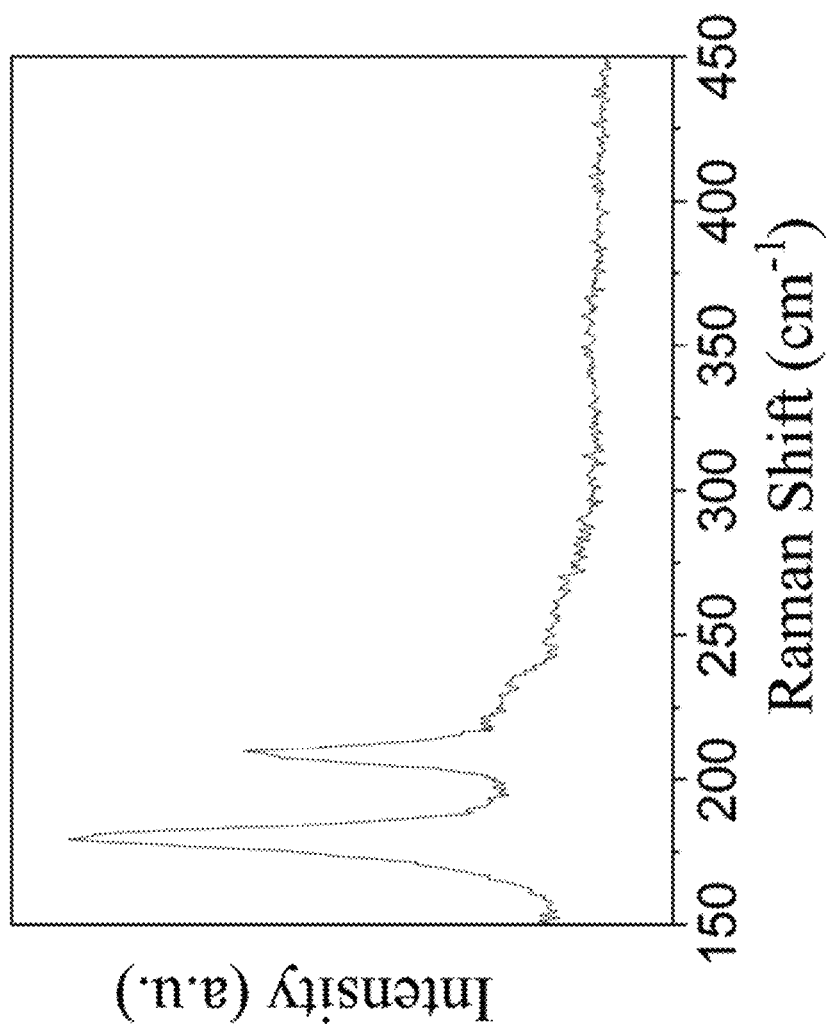
FIG. 6 is a characteristic curve showing a Raman spectrum of the platinum diselenide of the present disclosure.

FIG. 4 is a characteristic curve showing a Raman spectrum of the tungsten diselenide of the present disclosure; FIG. 5 is a characteristic curve showing a Raman spectrum of the molybdenum diselenide of the present disclosure; and FIG. 6 is a characteristic curve showing a Raman spectrum of the platinum diselenide of the present disclosure. In FIG. 4, the tungsten diselenide has two peaks located at 247 $cm^{-1}$ and 250 $cm^{-1}$, respectively. The peak at 300 $cm^{-1}$ corresponds to the silicon substrate. These two peaks are very close to each other so that they merge together. In this process, the silicon dioxide containing substrate is heated at the loading substrate temperature about 200° C. The plasma power is equal to 500 watts. The first thickness of the tungsten oxide layer is equal to 7 nm, and the solid selenium is heated at the temperature about 200° C.

In FIG. 5, the molybdenum selenide has two peaks located at 243 $cm^{-1}$ and 290 $cm^{-1}$, respectively. The peak at 300 $cm^{-1}$ corresponds to the silicon substrate. In this process, the silicon dioxide containing substrate is heated at the loading substrate temperature about 250° C. The plasma power is equal to 400 watts. The first thickness of the molybdenum oxide layer is equal to 7 nm, and the solid selenium is heated at the temperature about 150° C.

In FIG. 6, the platinum selenide has two peaks located at 177 $cm^{-1}$ and 205 $cm^{-1}$, respectively. In this process, the silicon dioxide containing substrate is heated at the loading substrate temperature about 250° C. The plasma power is equal to 400 watts. The first thickness of the platinum layer is equal to 50 nm, and the solid selenium is heated at the temperature about 150° C.

Figures 7A, 7B, 7C:
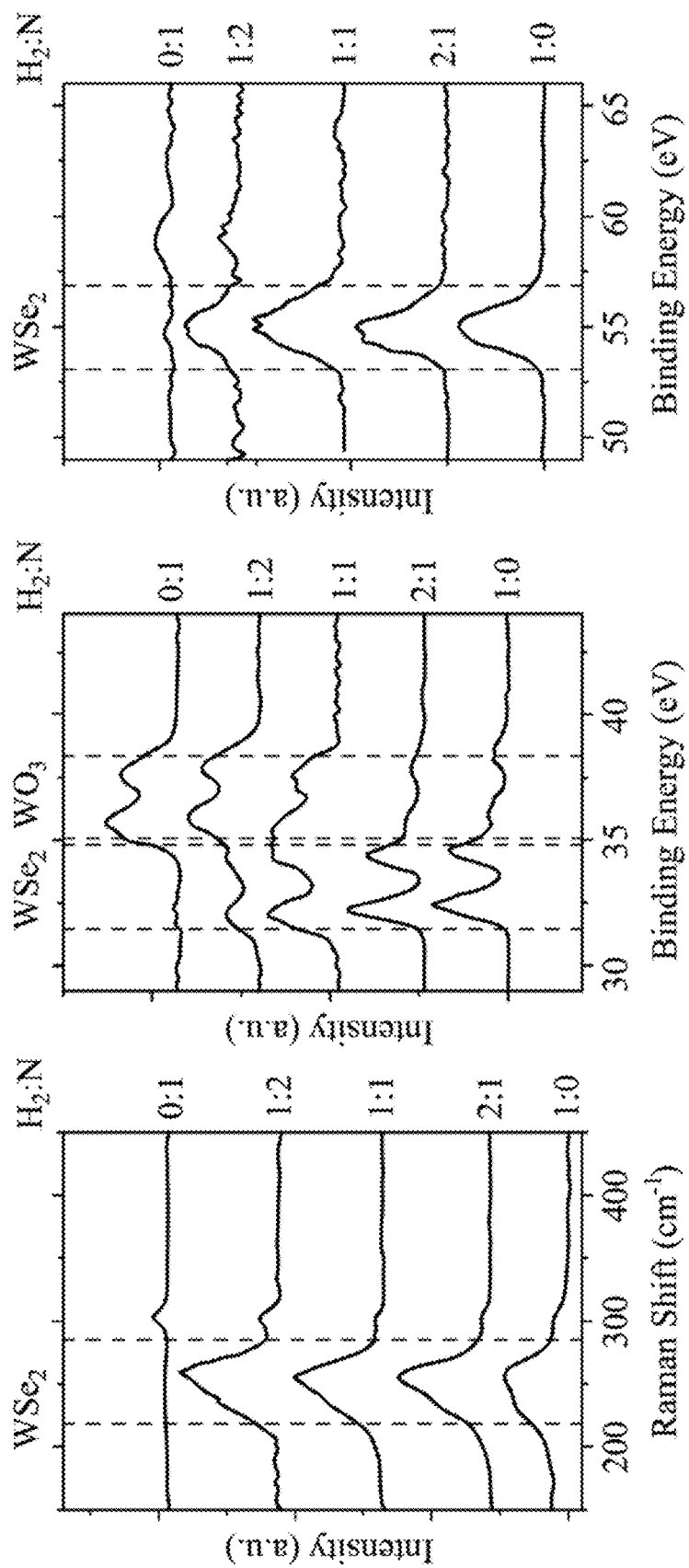
FIG. 7A is a characteristic curve showing a Raman spectrum of different flow rate ratios between nitrogen and hydrogen for forming the tungsten diselenide.
FIGS. 7B and 7C are characteristic curves showing an X-ray photoelectron spectrum of different flow rate ratios between nitrogen and hydrogen for forming the tungsten diselenide.

FIG. 7A is a characteristic curve showing a Raman spectrum of different flow rate ratios between nitrogen and hydrogen for forming the tungsten diselenide; and FIGS. 7B and 7C are characteristic curves showing an X-ray photoelectron spectrum (XPS) of different flow rate ratios between nitrogen and hydrogen for forming the tungsten diselenide. The flow rate ratios between nitrogen and hydrogen from top to bottom are 1:0, 2:1, 1:1, 1:2 and 0:1. The corresponding conversion efficiencies of the tungsten selenide layer formed from the tungsten oxide layer are 0%, 40%, 60%, 82% and 85%, respectively. Therefore, the method of the invention can really control the conversion efficiency of the transition metal dichalcogenide layer 230 by changing the flow rate ratio between nitrogen and hydrogen.

The position of the peaks in XPS is specific for the binding energy between different materials. For tungsten diselenide ($WSe_2$), the binding energy is at 32.1 eV and 34 eV. For tungsten oxide ($WO_3$), the binding energy is at 35.3 eV and 37.4 eV. In FIGS. 7B and 7C, the total area under the curve is used to estimate the percentage of $WSe_2$ and $WO_3$, for explaining the conversion efficiency.

Figure 8C:
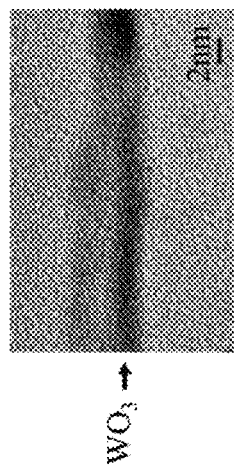
FIG. 8C is a transmission electron microscope image showing a cross-section view of a tungsten oxide layer with a thickness of 4-5 nm.
Figure 8D:
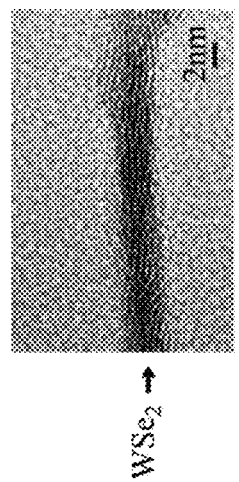
FIG. 8D is a transmission electron microscope image showing a cross-section view of a tungsten selenide layer with the thickness of 2-3 nm corresponding to FIG. 8C after selenization.
Figure 8E:
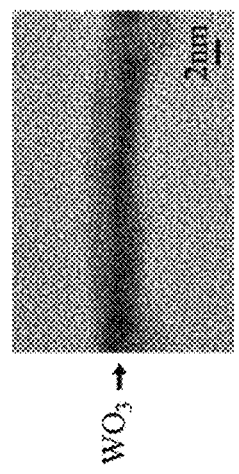
FIG. 8E is a transmission electron microscope image showing a cross-section view of a tungsten oxide layer with a thickness of 5-7 nm.
Figure 8F:
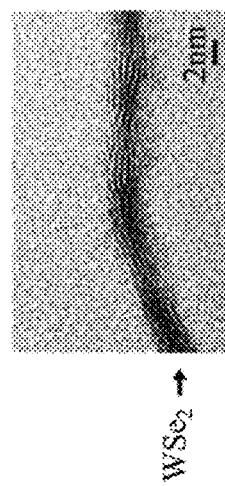
FIG. 8F is a transmission electron microscope image showing a cross-section view of a tungsten selenide layer with the thickness of 4-5 nm corresponding to FIG. 8E after selenization.
Figure 8A:
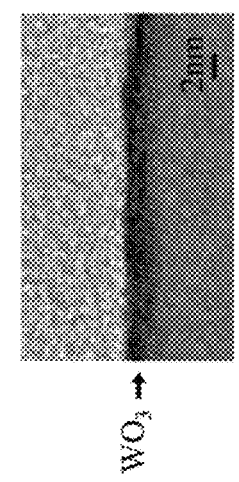
FIG. 8A is a transmission electron microscope image showing a cross-section view of a tungsten oxide layer with a thickness of 2 nm.
Figure 8B:
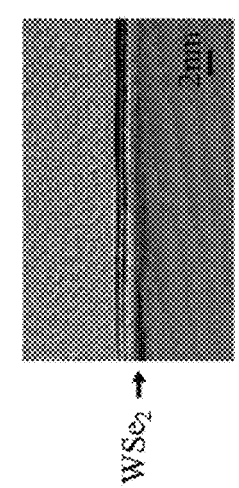
FIG. 8B is a transmission electron microscope image showing a cross-section view of a tungsten selenide layer with the thickness of 1.4 nm corresponding to FIG. 8A after selenization.

FIG. 8A is a transmission electron microscope (TEM) image showing a cross-section view of a tungsten oxide layer with a thickness of 2 nm; FIG. 8B is the TEM image showing a cross-section view of a tungsten selenide layer with the thickness of 1.4 nm (equivalent to 2 atomic layers) after selenization of the film shown in FIG. 8A; FIG. 8C is a TEM image showing a cross-section view of a tungsten oxide layer with a thickness of 5 nm; FIG. 8D is the TEM image showing a cross-section view of a tungsten selenide layer with the thickness of 2-3 nm (equivalent to 4-5 atomic layers) after selenization of the film shown in FIG. 8C; FIG. 8E is a TEM image showing a cross-section view of a tungsten oxide layer with a thickness of 7 nm; and FIG. 8F is the TEM image showing a cross-section view of a tungsten selenide layer with the thickness of 4-5 nm (equivalent to 7-8 atomic layers) after selenization of the film shown in FIG. 8E. In FIGS. 8A-8F, the larger the thickness is, the larger the number of atomic layers corresponding to the transition metal dichalcogenide layer 230 is. The thickness is corresponding to the number of atomic layers in a specific proportion. Hence, the method of the invention can really control the number of atomic layers of the transition metal oxide layer 220 by changing the thickness of the transition metal dichalcogenide layer 230.

Figure 9A:
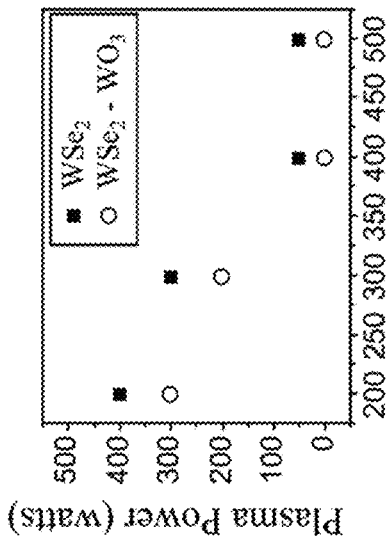
FIG. 9A is a characteristic curve showing a plasma power of a tungsten selenide layer with the thickness of 7 nm corresponding to a loading substrate temperature.
Figure 9B:
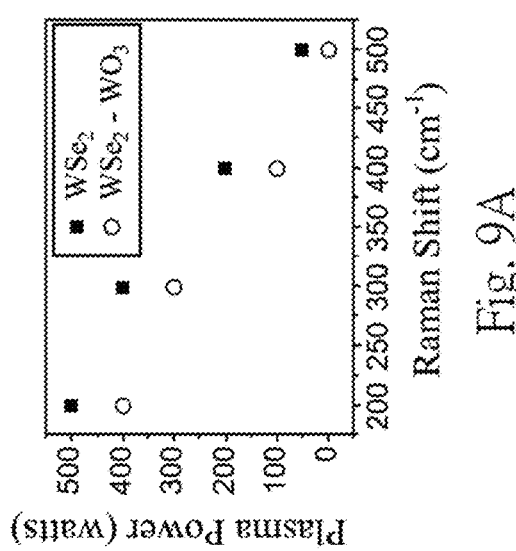
FIG. 9B is a characteristic curve showing a plasma power of a tungsten selenide layer with the thickness of 5 nm corresponding to a loading substrate temperature.
Figure 9C:
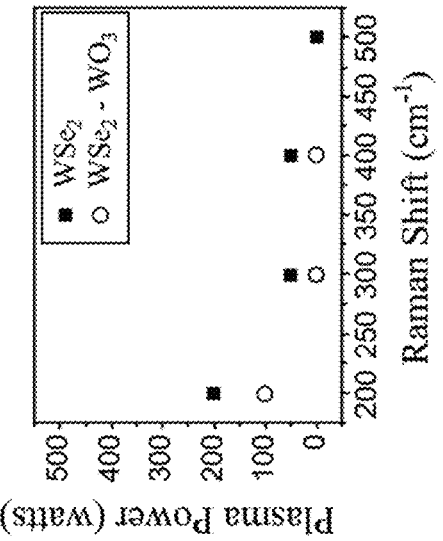
FIG. 9C is a characteristic curve showing a plasma power of a tungsten selenide layer with the thickness of 2 nm corresponding to a loading substrate temperature.

FIG. 9A is a characteristic curve showing a plasma power of a tungsten selenide layer with the thickness of 7 nm corresponding to the loading substrate temperature; FIG. 9B is a characteristic curve showing the plasma power of the tungsten selenide layer with the thickness of 5 nm corresponding to the loading substrate temperature; and FIG. 9C is a characteristic curve showing a plasma power of the tungsten selenide layer with the thickness of 2 nm corresponding to the loading substrate temperature. The solid square dots represent the characteristic of the tungsten selenide, and hollow circular dots represent the characteristic of a mixture of the tungsten selenide and the tungsten oxide. Thus, the lower the loading substrate temperature is, the higher the plasma power is needed. In addition, the larger the thickness is, the higher the plasma power is needed.

Figure 10:
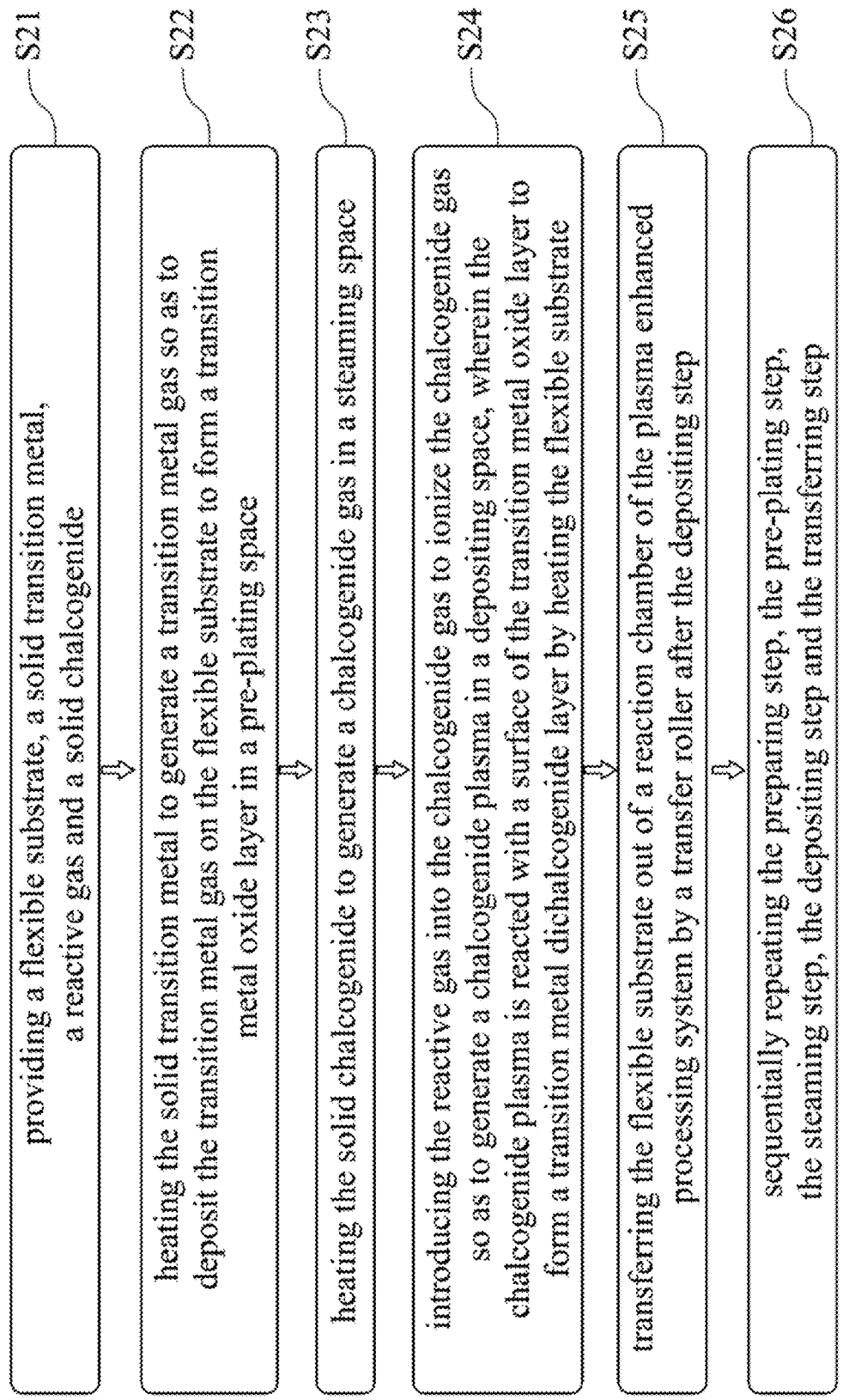
FIG. 10 is a flow chart showing a method of fabricating transition metal dichalcogenides according to further another embodiment of the present disclosure.

FIG. 10 is a flow chart showing a method of fabricating TMDs using a plasma enhanced processing system 300 according to further another embodiment of the present disclosure; and FIG. 11 is a schematic view of the plasma enhanced processing system 300 of fabricating TMDs used in FIG. 10. In FIG. 10, a method of fabricating TMDs using the plasma enhanced processing system 300 includes a preparing step S21, a pre-plating step S22, a steaming step S23, a depositing step S24, a transferring step S25 and a mass production step S26. The preparing step S21 is performed for providing a flexible substrate 410, a solid transition metal, a reactive gas and a solid chalcogenide. The pre-plating step S22 is performed for heating the solid transition metal to generate a transition metal gas so as to deposit the transition metal gas on the flexible substrate 410 to form a transition metal oxide layer 420 in a pre-plating space. The steaming step S23 is performed for heating the solid chalcogenide to generate a chalcogenide gas in a steaming space. The depositing step S24 is performed for introducing the reactive gas into the chalcogenide gas to ionize the chalcogenide gas so as to generate a chalcogenide plasma in a depositing space. The chalcogenide plasma is reacted with a surface of the transition metal oxide layer 420 to form a transition metal dichalcogenide layer (not shown) by heating the flexible substrate 410. The depositing step S24 is performed under a process vacuum pressure. The transferring step S25 is performed for transferring the flexible substrate 410 out of a reaction chamber of the plasma enhanced processing system 300 by a transfer roller after the depositing step S24. The mass production step S26 is performed for sequentially repeating the preparing step S21, the pre-plating step S22, the steaming step S23, the depositing step S24 and the transferring step S25.

In FIG. 10, the details of the pre-plating step S22, the steaming step S23 and the depositing step S24 are the same as the pre-plating step S02, the steaming step S03 and the depositing step S04 of FIG. 1, respectively. In FIG. 10, the preparing step S21 provides the flexible substrate 410 making process under atmospheric pressure in the plasma enhanced processing system 300.

In FIG. 11, the plasma enhanced processing system 300 includes an atmospheric pressure plasma generator 310, a first gas inlet 320, a second gas inlet 330, a heater 340 and a transfer roller 350. The first gas inlet 320 is used for conveying hydrogen gas, and the second gas inlet 330 is used for conveying nitrogen gas and a chalcogenide gas generated by heating the solid chalcogenide. In the pre-plating step S22, the flexible substrate 410 is coated by vapor deposition or sputtering process to form the transition metal oxide layer 420. The chalcogenide gas and the reactive gas are flowed from top to bottom through to a top of the transition metal oxide layer 420 by the atmospheric pressure plasma generator 310. The heater 340 can heat the flexible substrate 410 to form the transition metal dichalcogenide layer. The transferring step S25 is implemented after performing the depositing step S24. The flexible substrate 410 is transferred out of the reaction chamber by the transfer roller 350. The mass production step S26 is implemented after performing the transferring step S25. The mass production step S26 is performed for sequentially repeating the preparing step S21, the pre-plating step S22, the steaming step S23, the depositing step S24 and the transferring step S25, so that there are lots of flexible substrates 410 connected sequentially to each other. Thus, since the flexible substrates 410 are linked with the transfer roller 350 continuously, the fixed atmospheric pressure plasma generator 310 can be used to form a new transition metal dichalcogenide layer on each of the flexible substrates 410, so that a large number of transition metal dichalcogenide layers can be generated at low temperature under the process vacuum pressure low vacuum pressure to atmospheric pressure.

According to the aforementioned embodiments and examples, the advantages of the present disclosure are described as follows.

1. These methods of fabricating TMDs and transition metal selenides of the present disclosure can use the lower loading substrate temperature and the lower degree of vacuum to form the transition metal dichalcogenide layer and the transition metal selenide layer.

2. These methods of fabricating TMDs and transition metal selenides of the present disclosure can prevent the toxic gas, such as $H_2S$, used as the fabricating source in the coating process and environmental pollution.

3. These methods of fabricating TMDs and transition metal selenides of the present disclosure can reduce fabrication steps and fabrication cost. Most important of all, these methods of the present disclosure can use the flexible substrates under a low vacuum pressure to atmospheric pressure to construct a mass production procedure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating transition metal dichalcogenides, comprising:
    performing a preparing step for providing a loading substrate, a solid transition metal, a reactive gas and a solid chalcogenide, wherein the solid chalcogenide is a chemical element selected from the group consisting of sulfur, selenium, and tellurium;
    performing a pre-plating step for heating the solid transition metal to generate a transition metal gas so as to deposit the transition metal gas on the loading substrate to form a transition metal oxide layer in a pre-plating space;
    performing a steaming step for heating the solid chalcogenide to generate a chalcogenide gas in a steaming space;
    performing a depositing step for introducing the reactive gas into the chalcogenide gas to ionize the chalcogenide gas so as to generate a chalcogenide plasma in a depositing space, wherein the chalcogenide plasma is reacted with a surface of the transition metal oxide layer to form a transition metal dichalcogenide layer by heating the loading substrate, and the depositing step is performed under a process vacuum pressure;
    performing a thickness controlling step for changing the thickness of the transition metal oxide layer thereby changing the number of atomic layers corresponding to the transition metal dichalcogenide layer; and
    performing a conversion controlling step for controlling a flow rate ratio of the reactive gas to change a conversion efficiency of the transition metal dichalcogenide layer during the process of the chalcogenide plasma reacting with the transition metal oxide layer;
    wherein the steps of the method of fabricating transition metal dichalcogenides are carried out in order of the preparing step, the pre-plating step, the steaming step, the depositing step, the thickness controlling step, and where the step of the conversion controlling step is performed during the depositing step;
    wherein in the depositing step, the reactive gas and the chalcogenide gas are flowed from top to bottom through a top of the transition metal oxide layer, the process vacuum pressure is performed from low vacuum pressure to atmospheric pressure, the loading substrate is heated at a loading substrate temperature from 150° C. to 500° C., and the depositing space is different from the steaming space and the pre-plating space;
    wherein the process vacuum pressure is greater than or equal to 2 Torr and is smaller than or equal to 760 Torr;
    wherein the depositing step is performed with a plasma power which is greater than or equal to 0 watt and smaller than or equal to 500 watts;
    wherein after performing the pre-plating step, a thickness of the transition metal oxide layer is greater than or equal to 1 nm and smaller than or equal to 10 nm;
    wherein the reactive gas comprises nitrogen and hydrogen.

2. The method of claim 1, wherein the loading substrate is made of polyamide, stainless steel, glass, silicon nitride, silicon dioxide, aluminum oxide or hafnium oxide.

3. The method of claim 1, wherein the solid transition metal is made of tungsten, molybdenum, nickel, copper, indium, germanium, tantalum, iron, cobalt or titanium.

4. The method of claim 1, wherein the steaming step is for heating the solid chalcogenide at a steaming temperature from 90° C. to 150° C. when the solid chalcogenide is made from sulfur.

5. The method of claim 1, wherein the steaming step is for heating the solid chalcogenide at a steaming temperature from 150° C. to 300° C. when the solid chalcogenide is made from selenium.

6. The method of claim 1, wherein the steaming step is for heating the solid chalcogenide at a steam temperature from 400° C. to 650° C. when the solid chalcogenide is made from tellurium.

7. The method of claim 1, wherein when the thickness is smaller than 7 nm and the loading substrate temperature is equal to 500° C., the plasma power is 0 watt.

8. The method of claim 1, wherein the thickness controlling step is for generating one atomic layer corresponding to the transition metal dichalcogenide layer when the thickness is equal to 1 nm.

9. The method of claim 1, wherein the flow rate ratio between nitrogen and hydrogen is 1:2 or 2:1.

10. The method of claim 1, wherein the pre-plating step is for forming a transition metal oxide layer by an atomic layer epitaxy process, a sputtering process or an evaporation process.

11. The method of claim 1, further comprising:
performing a transferring step for transferring the loading substrate out of the depositing space after the depositing step, wherein the loading substrate is made of flexible material; and
performing a mass production step for sequentially repeating the preparing step, the pre-plating step, the steaming step, the depositing step and the transferring step.

12. A method of fabricating transition metal dichalcogenides, comprising:
performing a preparing step for providing a loading substrate, a solid transition metal, a reactive gas and a solid chalcogenide, wherein the solid chalcogenide is a chemical element selected from the group consisting of sulfur, selenium, and tellurium;
performing a pre-plating step for heating the solid transition metal to generate a transition metal gas so as to deposit the transition metal gas on the loading substrate to form a transition metal layer in a pre-plating space;
performing a steaming step for heating the solid chalcogenide to generate a chalcogenide gas in a steaming space;
performing a depositing step for introducing the reactive gas into the chalcogenide gas to ionize the chalcogenide gas so as to generate a chalcogenide plasma in a depositing space, wherein the chalcogenide plasma is reacted with a surface of the transition metal layer to form a transition metal dichalcogenide layer by heating the loading substrate, and the depositing step is performed under a process vacuum pressure;
performing a thickness controlling step for changing the thickness of the transition metal layer thereby changing the number of atomic layers corresponding to the transition metal dichalcogenide layer; and
performing a conversion controlling step for controlling a flow rate ratio of the reactive gas to change a conversion efficiency of the transition metal dichalcogenide layer during the process of the chalcogenide plasma reacting with the transition metal layer;
wherein the steps of the method of fabricating transition metal dichalcogenides are carried out in order of the preparing step, the pre-plating step, the steaming step, the depositing step, the thickness controlling step, and where the step of the conversion controlling step is performed during the depositing step;
wherein in the depositing step, the reactive gas and the chalcogenide gas are flowed from top to bottom through a top of the transition metal layer, the process vacuum pressure is performed from low vacuum pressure to atmospheric pressure, the loading substrate is heated at a loading substrate temperature from 150° C. to 500° C., and the depositing space is different from the steaming space and the pre-plating space;
wherein the process vacuum pressure is greater than or equal to 2 Torr and is smaller than or equal to 760 Torr,
wherein the depositing step is performed with a plasma power which is greater than or equal to 0 watt and smaller than or equal to 500 watts;
wherein after performing the pre-plating step, a thickness of the transition metal layer is greater than or equal to 1 nm and smaller than or equal to 50 nm;
wherein the reactive gas comprises nitrogen and hydrogen.

13. The method of claim 12, wherein the loading substrate is made of polyamide, stainless steel, glass, silicon nitride, silicon dioxide, aluminum oxide or hafnium oxide.

14. The method of claim 12, wherein the solid transition metal is made of platinum.

15. The method of claim 12, wherein the steaming step is for heating the solid chalcogenide at a steaming temperature from 90° C. to 150° C. when the solid chalcogenide is made from sulfur.

16. The method of claim 12, wherein the steaming step is for heating the solid chalcogenide at a steaming temperature from 150° C. to 300° C. when the solid chalcogenide is made from selenium.

17. The method of claim 12, wherein the steaming step is for heating the solid chalcogenide at a steam temperature from 400° C. to 650° C. when the solid chalcogenide is made from tellurium.

18. The method of claim 12, wherein when the thickness is smaller than 7 nm and the loading substrate temperature is equal to 500° C., the plasma power is 0 watt.

19. The method of claim 12, wherein the thickness controlling step is for generating one atomic layer corresponding to the transition metal dichalcogenide layer when the thickness is equal to 1 nm.

20. The method of claim 12, wherein the flow rate ratio between nitrogen and hydrogen is 1:2 or 2:1.

21. The method of claim 12, wherein the pre-plating step is for forming a transition metal layer by an atomic layer epitaxy process, a sputtering process or an evaporation process.

22. The method of claim 12, further comprising:
performing a transferring step for transferring the loading substrate out of the depositing space after the depositing step, wherein the loading substrate is made of flexible material; and
performing a mass production step for sequentially repeating the preparing step, the pre-plating step, the steaming step, the depositing step and the transferring step.

* * * * *